(12) United States Patent
Ogasawara et al.

(10) Patent No.: US 8,298,960 B2
(45) Date of Patent: Oct. 30, 2012

(54) PLASMA ETCHING METHOD, CONTROL PROGRAM AND COMPUTER STORAGE MEDIUM

(75) Inventors: Masahiro Ogasawara, Nirasaki (JP); Sungtae Lee, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 513 days.

(21) Appl. No.: 12/497,106

(22) Filed: Jul. 2, 2009

(65) Prior Publication Data

US 2010/0003825 A1 Jan. 7, 2010

Related U.S. Application Data

(60) Provisional application No. 61/092,628, filed on Aug. 28, 2008.

(30) Foreign Application Priority Data

Jul. 4, 2008 (JP) .................................. 2008-175391

(51) Int. Cl.
*H01L 21/302* (2006.01)
*H01L 21/461* (2006.01)

(52) U.S. Cl. ........................... 438/736; 438/717; 216/47

(58) Field of Classification Search .................. 438/736, 438/717; 216/47
See application file for complete search history.

(56) References Cited

U.S. PATENT DOCUMENTS

2007/0284335 A1  12/2007  Tsujimoto

FOREIGN PATENT DOCUMENTS

| JP | 2007-294943 | 11/2007 |
| JP | 2009-076661 | 4/2009 |

OTHER PUBLICATIONS

Office Action issued May 8, 2012, in Japanese Patent Application No. 2008-175391.

*Primary Examiner* — Roberts Culbert
(74) *Attorney, Agent, or Firm* — Oblon, Spivak, McClelland, Maier & Neustadt, L.L.P.

(57) ABSTRACT

A plasma etching method, for plasma-etching a target substrate including at least a film to be etched, an organic film to become a mask of the to-be-etched film, and a Si-containing film which are stacked in order from bottom, includes the first organic film etching step, the treatment step and the second organic film etching step when the organic film is etched to form a mask pattern of the to-be-etched film. In the first organic film etching step, a portion of the organic film is etched. In the treatment step, the Si-containing film and the organic film are exposed to plasma of a rare gas after the first organic film etching step. In the second organic film etching step, the remaining portion of the organic film is etched after the treatment step.

6 Claims, 4 Drawing Sheets

PLASMA ETCHING METHOD, CONTROL PROGRAM AND COMPUTER STORAGE MEDIUM

CROSS-REFERENCE TO RELATED APPLICATIONS

This application claims priority to Japanese Patent Application No. 2008-175391, filed on Jul. 4, 2008, the entire contents of which are hereby incorporated by reference.

FIELD OF THE INVENTION

The present invention relates to a plasma etching method of etching a subject substrate using plasma, a control program for executing the plasma etching method and a computer storage medium storing the control program.

BACKGROUND OF THE INVENTION

In a semiconductor manufacturing process, conventionally, a silicon oxide film or the like is formed to have a desired pattern by performing plasma etching via a mask layer. With miniaturization of circuits in semiconductor devices, such plasma etching requires finer processes with high precision.

As one of techniques for performing such finer processes with high precision, there is a technique which uses a hard mask such as amorphous carbon or SOH (Spin On Hardmask) as a mask when contact holes are formed by plasma etching. It is known that a film containing carbon (C) of such amorphous carbon or SOH is etched by $O_2$-based plasma and a mixture gas of CO and $O_2$ is, for example, used as an etching gas (see, e.g., Japanese Patent Application Publication No. 2007-294943 and corresponding U.S. Patent Application Publication No. 2007-284335A).

However, as mentioned above, when the amorphous carbon is etched by plasma using the mixture gas of CO and $O_2$ as the etching gas, for example, a diameter of a contact hole decreases due to miniaturization of an etching pattern, a so-called bowing effect that a shape of a side wall of the hole is curved outwardly is likely to occur. In addition, when a silicon oxide film is plasma-etched by using amorphous carbon or the like having bowing as a mask, there arises a problem that an error occurs in a shape of hole in the silicon oxide film. In addition, when a hole such as a contact hole or the like is formed, such bowing becomes noticeable as a diameter of the hole becomes smaller than 0.8 μm.

SUMMARY OF THE INVENTION

In view of the above, the present invention provides a plasma etching method which is capable of effectively preventing bowing from occurring, as compared to conventional techniques, and performing finer processes with high precision, a control program for executing the plasma etching method and a computer storage medium storing the control program.

In accordance with a first aspect of the present invention, there is provided a plasma etching method of plasma-etching a subject substrate including at least a film to be etched, an organic film to become a mask of the to-be-etched film, and a Si-containing film which are stacked in order from bottom, including at least: when the organic film is etched to form a mask pattern of the to-be-etched film, a first organic film etching step of etching a portion of the organic film; a treatment step of exposing the Si-containing film and the organic film to plasma of a rare gas after the first organic film etching step; and a second organic film etching step of etching the remaining portion of the organic film after the treatment step.

In accordance with a second aspect of the present invention, there is provided a control program which operates on a computer and, when executed, controls a plasma etching apparatus to perform a plasma etching method.

In accordance with a third aspect of the present invention, there is provided a computer storage medium in which a control program operating on a computer is stored, wherein, when executed, the control program controls a plasma etching apparatus to perform a plasma etching method.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
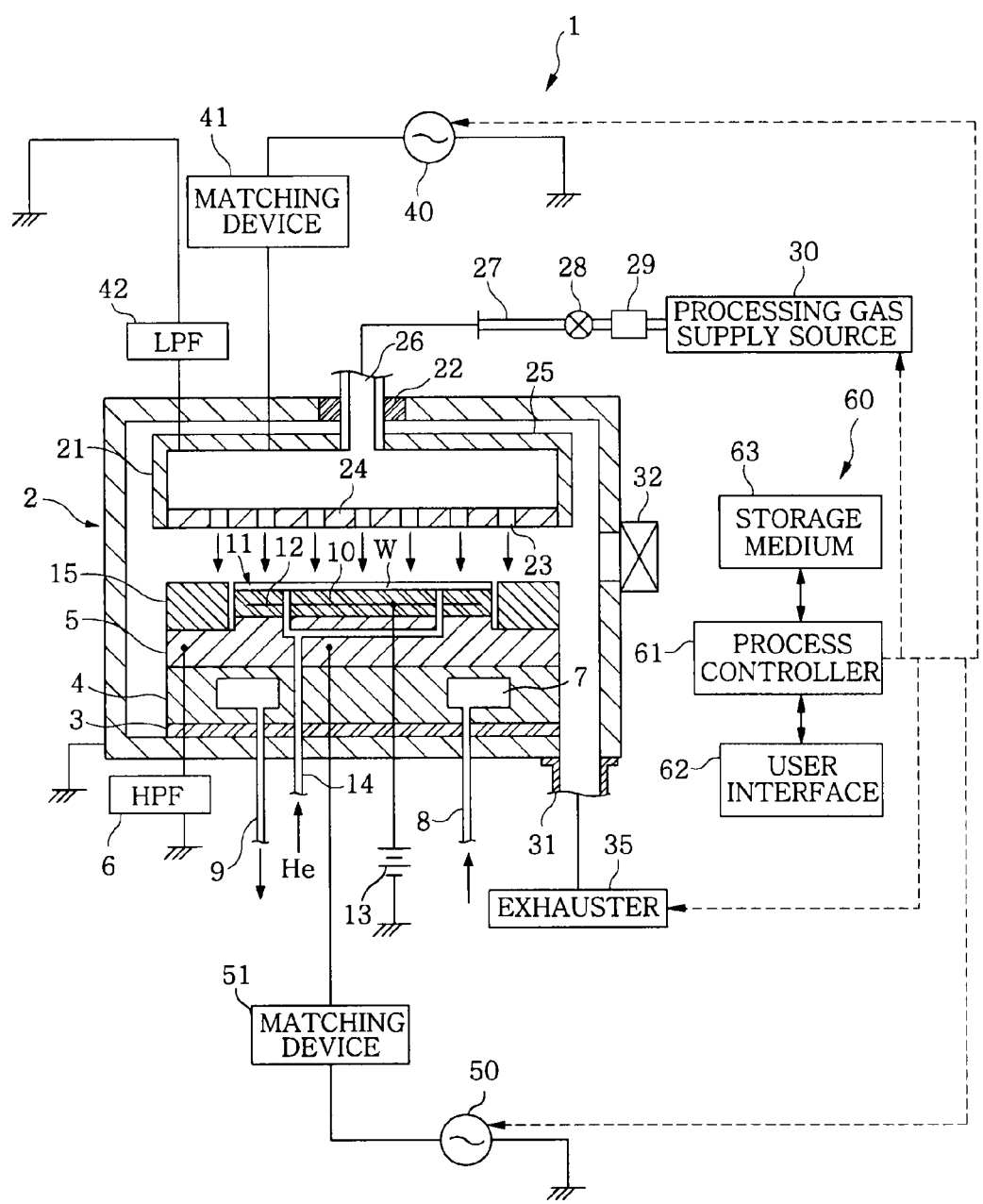
FIG. 1 is a view showing a configuration of a plasma etching apparatus in accordance with one embodiment of the present invention.

Hereinafter, an embodiment of the present invention will be described with reference to the accompanying drawings which form a part hereof. FIG. 1 shows a configuration of a plasma etching apparatus in accordance with the embodiment of the present invention.

A plasma etching apparatus 1 is configured as a capacitively coupled parallel plate type etching apparatus in which an upper and a lower electrode plate are disposed opposite to each other in parallel and plasma-generating power supplies are respectively connected to both of the electrode plates.

The plasma etching apparatus 1 includes a grounded cylindrical process chamber (process container) 2 made of, e.g., aluminum whose surface is anodited. A columnar susceptor support 4, for mounting thereon a target substrate, e.g., a semiconductor wafer W, is provided on the bottom of the process chamber 2 via an insulating plate 3 made of ceramic or the like. In addition, a susceptor 5 serving as a lower electrode is disposed on the susceptor support 4. A high pass filter (HPF) 6 is connected to the susceptor 5.

A coolant path 7 is provided within the susceptor support 4. A coolant is introduced and circulated in the coolant path 7 through a coolant introduction pipe 8 and is discharged through a coolant discharge pipe 9. The cold heat of the coolant is transferred to the semiconductor wafer W, so that the semiconductor wafer W is controlled to a desired temperature.

An upper central portion of the susceptor 5 is protruded in a disc shape and an electrostatic chuck 11 having the substantial same shape as the semiconductor wafer W is disposed on the upper central portion. The electrostatic chuck 11 is configured by arranging an electrode 12 within an insulating material. The electrostatic chuck 11 electrostatically attracts and holds the semiconductor wafer W by, for example, a Coulomb force generated by applying a DC voltage of, e.g., 1.5 kV from a DC power supply 13, which is connected to the electrode 12, to the electrostatic chuck 11.

A gas passage 14 for supplying a heat transfer medium (e.g., He gas or the like) to a back surface of the semiconductor wafer W is provided in the insulating plate 3, the susceptor support 4, the susceptor 5 and the electrostatic chuck 11, and the cold heat of the susceptor 5 is transferred to the semiconductor wafer W through the heat transfer medium so that the semiconductor wafer W is maintained at a desired temperature.

An annular focus ring 15 is disposed on the upper peripheral edge portion of the susceptor 5 to surround the semiconductor wafer W mounted on the electrostatic chuck 11. The focus ring 15 serves to improve etching uniformity.

An upper electrode 21 is disposed above the susceptor 5 in parallel to and opposite to the susceptor 5. The upper electrode 21 is held by the upper portion of the process chamber 2 via an insulating material 22. The upper electrode 21 includes an electrode plate 24 and a conductive electrode support 25 for holding the electrode plate 24. The electrode plate 24 is made of, e.g., a conductor or a semiconductor and includes a plurality of injection holes 23. The electrode plate 24 has a surface opposite to the susceptor 5.

A gas inlet 26 is provided in the center of the electrode support 25 in the upper electrode 21 and a gas supply pipe 27 is connected to the gas inlet 26. In addition, a processing gas supply source 30 is connected to the gas supply pipe 27 via a valve 28 and a mass flow controller 29. An etching gas for plasma etching process and a rare gas for treatment are supplied from the processing gas supply source 30.

A gas exhaust pipe 31 is connected to the bottom of the process chamber 2 and a gas exhaust unit 35 is connected to the exhaust pipe 31. The gas exhaust unit 35 includes a vacuum pump such as a turbo molecule pump and is configured to exhaust the inside of the process chamber 2 to a pressurized atmosphere, for example, a pressure of 1 Pa or less. In addition, a gate valve 32 is provided in a side wall of the process chamber 2 and the semiconductor wafer W is transferred into an adjacent load lock chamber (not shown) which the gate valve 32 is opened.

A first radio frequency (RF) power supply 40 is connected to the upper electrode 21 and a matching unit 41 is provided on a power feed line extending between the first RF power supply 40 and the upper electrode 21. In addition, a low pass filter (LPF) 42 is connected to the upper electrode 21. The first RF power supply 40 has a frequency ranging from 50 to 150 MHz (60 MHz in this embodiment). A high-density plasma in a desirable dissociated state can be generated by applying RF power of such a high frequency to the upper electrode 21.

A second RF power supply 50 is connected to the susceptor 5 serving as the lower electrode and a matching unit 51 is provided on a power feed line extending between the second RF power supply 50. The second RF power supply 50 has a frequency range lower than that of the first RF power supply 40 and a proper ion action can be made to the semiconductor wafer W as the subject substrate without doing damage to the semiconductor wafer W by applying RF power of such a frequency range to the susceptor 5. That is, the second RF power supply 50 is for applying RF power for bias. A frequency of the second RF power supply 50 is preferably 1 to 20 MHz (2 MHz in this embodiment).

Operation of the above-configured plasma etching apparatus 1 is generally controlled by a control unit 60. The control unit 60 includes a process controller 61 having a CPU for controlling components of the plasma etching apparatus 1, a user interface 62 and a storage unit 63.

The user interface 62 includes a keyboard to allow a process manager to input commands for managing the plasma etching apparatus 1, a display for displaying operation situations of the plasma etching apparatus 1, and the like.

In the storage unit 63 stores recipes including control programs (software) for controlling various processes performed in the plasma etching apparatus 1 under the control of the process controller 61, process condition data, and the like. If necessary, the process controller 61 executes a recipe read from the storage unit 63 in response to instructions from the user interface 62, thereby performing a desired process in the plasma etching apparatus 1 under the control of the process controller 61. In addition, the recipes of the control program, the process condition data, etc., can be stored in a computer-readable storage medium (for example, a hard disk, CD, flexible disk, semiconductor memory or the like.), or transmitted on-line from other devices through, e.g., a dedicated line when necessary.

When the above-configured plasma etching apparatus 1 performs plasma etching for the semiconductor wafer W, the semiconductor wafer W is first transferred from the load lock chamber (not shown) into the process chamber 2 with the gate valve 32 opened and then is loaded on the electrostatic chuck 11. Then, by applying a DC voltage from the DC power supply 13 to the electrostatic chuck 11, the semiconductor wafer W is electrostatically attracted and held on the electrostatic chuck 11. Then, the gate valve 32 is closed and the inside of the process chamber 2 is exhausted to a predetermined degree of vacuum by the gas exhausting unit 35.

Thereafter, the valve 28 is opened and a predetermined etching gas and a rare gas for treatment are introduced from the processing gas supply source 30 into a hollow of the upper electrode 21 through the process gas supply pipe 27 and the gas inlet 26, with their flow rate controlled by the mass flow controller 29, and are uniformly discharged toward the semiconductor wafer W through the injection holes 23 of the electrode plate 24, as indicated by arrows in FIG. 1.

Then, the inside of the process chamber 2 is maintained at a predetermined pressure. Thereafter, RF power of a predetermined frequency is applied from the first RF power supply 40 to the upper electrode 21. Accordingly, an RF electric field is produced between the upper electrode 21 and the susceptor 5 as the lower electrode and the etching gas is dissociated and plasmarized.

On the other hand, RF power of a frequency lower than that of the first RF power supply 40 is applied from the second RF power supply 50 to the susceptor 5 as the lower electrode. Accordingly, ions in plasma are attracted toward the susceptor 5 and etching anisotropy is increased by ion assist.

When a predetermined plasma etching process is completed, the supply of RF power and the supply of process gas are stopped and the semiconductor wafer W is carried out of the process chamber 2 in an order reverse to the above-described order.

Figure 2A:
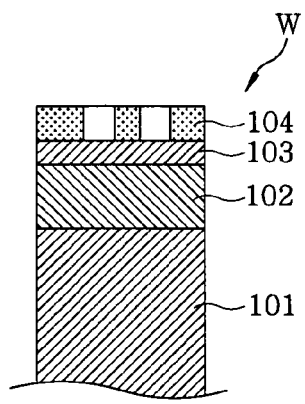
FIGS. 2A to 2E are views showing processes of a plasma etching method in accordance with one embodiment of the present invention.

FIGS. 2A to 2E schematically show enlarged main portions of the semiconductor wafer as the target substrate in this embodiment. As shown in FIG. 2A, the semiconductor wafer W has a structure including at least a silicon oxide film 101 as a film to be etched, an amorphous carbon film 102 as an organic film to become a mask of the silicon oxide film 101, and a SiON film 103 as a Si-containing film, which are stacked in order from bottom. A photoresist film 104 patterned in a predetermined shape is formed on the SiON film 103. The amorphous carbon film 102 has a thickness of, e.g., several hundred nanometers and the SiON film 103 has a thickness of, e.g., several tens nanometers.

The SiON film 103 acts as a portion of a bottom antireflective coating (BARC) when the photoresist film 104 is exposed, and, in actuality, an organic BARC film exists between the SiON film 103 and the photoresist film 104. Instead of the SiON film, for example, a SiC film, a SiN film, etc. may be used.

Figure 2D:
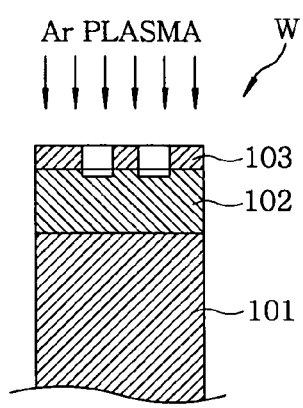
Figure 2B:
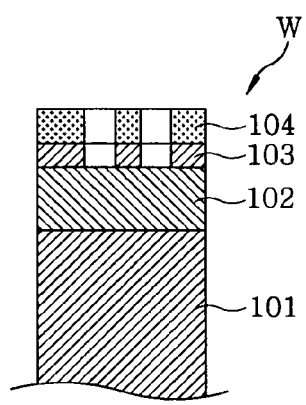

In this embodiment, from a state shown in FIG. 2A, the SiON film 103 is first plasma-etched to be in a state shown in FIG. 2B by using the photoresist film 104 as a mask. This plasma etching is performed using, for example, a fluorine-based gas such as $CF_4$ or the like.

Next, a process to form a mask for etching the silicon oxide film 101 by etching the amorphous carbon film 102 as the organic film is performed. In this process, a first organic film etching process to plasma-etch a portion of the organic amorphous carbon film 102 is first performed as shown in FIG. 2C. This plasma etching is performed using, for example, an oxygen-based gas (for example, a mixture of CO and $O_2$) as an etching gas. In this first organic film etching process, the photoresist film 104 is almost etched away, thereby exposing a surface of the SiON film 103.

Next, a treatment process to expose the SiON film 103 as a Si-containing film and the organic amorphous carbon film 102 to plasma of the rare gas is performed as shown in FIG. 2D. As the plasma of the rare gas, plasma of Ar gas is preferably used but plasma of other rare gases, for example, Xe gas, Kr gas, etc. may be also used. Here, "plasma of rare gas" basically refers to plasma of a single rare gas or a mixture of rare gases. However, a very small quantity (for example, less than or equal to 5% by flow rate) of additive gas other than the rare gas may be contained as long as the species and amount of the additive gas is such that the amorphous carbon film 102 and the SiON film 103 are not substantially etched.

Figure 2E:
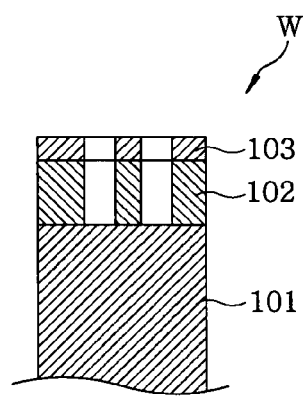
Figure 2C:
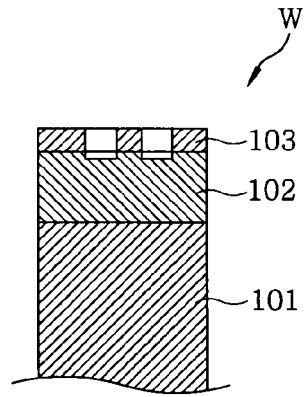

Next, a second organic film etching process to plasma-etch the remaining portion of the organic amorphous carbon film 102 is performed as shown in FIG. 2E. This plasma etching is performed by using the same etching gas as that in the first organic film etching process, for example, an oxygen-based etching gas (for example, a mixture of CO and $O_2$). Through the above-described three processes, a hard mask of the amorphous carbon film 102 is formed. Thereafter, the silicon oxide film 101 is plasma-etched to form contact holes and the like by using the amorphous carbon film 102 as a mask.

As described above, this embodiment performs three processes: the first organic film etching process to plasma-etch a portion of the amorphous carbon film 102, the treatment process to expose the amorphous carbon film 102 and the SiON film 103 to plasma of a rare gas, and the second organic film etching process to plasma-etch the remaining portion of the amorphous carbon film 102, instead of plasma-etching the organic amorphous carbon film 102 with a single process. This can prevent bowing in a side wall of the amorphous carbon film 102.

Figure 3A:
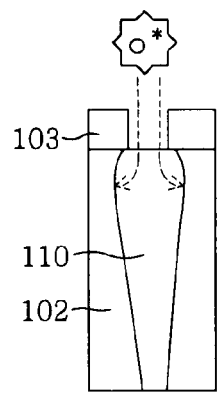
FIGS. 3A to 3B are views for explaining a bowing prevention mechanism in accordance with one embodiment of the present invention.
Figure 3B:
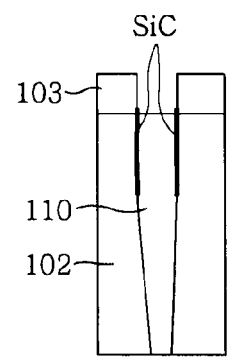

It is guessed that the prevention of bowing in this embodiment is grounded on the following reasons. That is, as shown in FIG. 3A, the reason why bowing occurs in the side wall of the amorphous carbon film 102 is that oxygen radical near an entrance of a hole 110 acts on a side wall of the hole 110 to etch away the side wall while etching is progressing toward the bottom of the hole 110. In the meantime, when the treatment process to expose the amorphous carbon film 102 and the SiON film 103 to the plasma of the rare gas is performed, as shown in FIG. 3B, a SiC protection film is formed on the side wall in the hole 110 of the amorphous carbon film 102 by Si generated from the Si-containing SiON film 103 and C generated from the organic amorphous carbon film 102 by action of the plasma of the rare gas. This SiC protection film acts to prevent bowing from occurring.

As an example, using the plasma etching apparatus 1 shown in FIG. 1, the semiconductor wafer W (30 cm in diameter) having the structure shown in FIG. 2A (60 nm of aperture diameter (top CD) of the photoresist film 104) was subjected to plasma etching by the following recipes.

The process controller 61 executes process recipes of respective examples, which will be described later, read from the storage unit 63 of the control unit 60. The process controller 61 controls components of the plasma etching apparatus 1 based on the control program, so that a plasma etching process is performed according to the read process recipes.

Figure 4A:
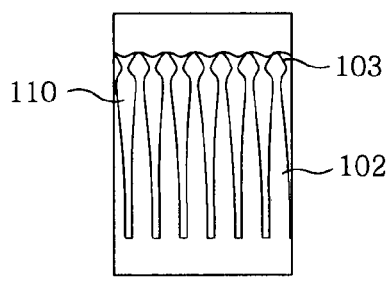
FIGS. 4A to 4B are schematic views showing etching shapes in one embodiment of the present invention and a comparative example.

(SiON Film Etching Process)
Etching gas: $CF_4$=150 sccm
Pressure: 6.67 Pa (50 mTorr)
Power (upper/lower): 300/300 W
Time: one minute and 17 seconds
(First Organic Film Etching Process)
Etching gas: $CO/O_2$=150/300 sccm
Pressure: 2.67 Pa (20 mTorr)
Power (upper/lower): 2000/1000 W
Time: 10 seconds
(Treatment Process)
Treatment gas: Ar=750 sccm
Pressure: 2.67 Pa (20 mTorr)
Power (upper/lower): 2000/1000 W
Time: 15 seconds
(Second Organic Film Etching Process)
Etching gas: $CO/O_2$=150/300 sccm
Pressure: 2.67 Pa (20 mTorr)
Power (upper/lower): 2000/1000 W
Time: one minute and 20 seconds As a comparative example, plasma etching was performed according to the following recipe which does not have the above-mentioned treatment process.
(SiON Film Etching Process)
Etching gas: $CF_4$=150 sccm
Pressure: 6.67 Pa (50 mTorr)
Power (upper/lower): 300/300 W
Time: one minute and 17 seconds
(Organic Film Etching Process)
Etching gas: $CO/O_2$=150/300 sccm
Pressure: 2.67 Pa (20 mTorr)
Power (upper/lower): 2000/1000 W
Time: one minute and 30 seconds In the comparative example, as shown in FIG. 4A, large bowing occurred in the side wall of the hole 110 of the amorphous carbon film 102. In this case, the remaining amount of mask (thickness of the SiON film 103 after the etching) was 62 nm, bowing CD (diameter of a portion having the largest diameter) was 63 nm, and bottom CD (diameter of the hole bottom) was 24 nm.

Figure 4B:
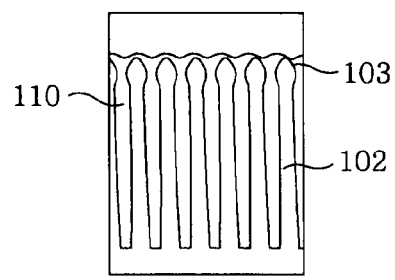

On the other hand, in the above example of the invention, as shown in FIG. 4B, bowing could be suppressed from occurring in the side wall of the hole 110 of the amorphous carbon film 102, as compared to the comparative example. In this case, the remaining amount of mask (thickness of the SiON film 103 after the etching) was 44 nm, bowing CD (diameter of a portion having the largest diameter) was 43 nm, and bottom CD (diameter of the hole bottom) was 25 nm.

By the way, if Ar is used as a rare gas as in the above, some extent of RF power for bias (RF power applied to the susceptor (lower electrode) 5 shown in FIG. 1) is preferably supplied in the treatment process. FIG. 5 shows an examination result of a relation between a value of RF power for bias in the treatment process and the amount of occurred bowing. In this case, except for the value of RF power for bias in the treatment process, a plasma etching process was performed under the same conditions as shown below.

Figure 5A:
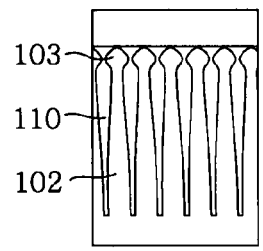
FIGS. 5A to 5C are schematic views showing an examination result of a relation between RF power for bias of a treatment process and an etching shape.
Figure 5B:
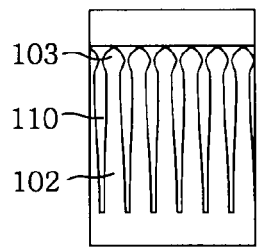
Figure 5C:
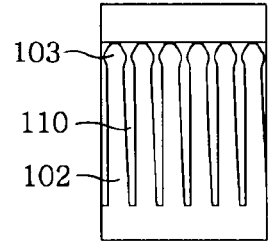

(SiON Film Etching Process)
Etching gas: $CF_4$=150 sccm
Pressure: 6.67 Pa (50 mTorr)
Power (upper/lower): 300/300 W
Time: one minute and 17 seconds
(First Organic Film Etching Process)
Etching gas: $CO/O_2$=150/300 sccm
Pressure: 2.67 Pa (20 mTorr)
Power (upper/lower): 2000/1000 W
Time: 10 seconds
(Treatment Process)
Treatment gas: Ar=750 sccm
Pressure: 2.67 Pa (20 mTorr)
Power (upper/lower): 2000/(0, 200, 1000) W
Time: 15 seconds
(Second Organic Film Etching Process)
Etching gas: $CO/O_2$=150/300 sccm
Pressure: 2.67 Pa (20 mTorr)
Power (upper/lower): 2000/1000 W
Time: one minute and 20 seconds FIGS. 5A, 5B and 5C show that the RF power for bias in the treatment process is 0 W, 200 W and 1000 W, respectively. As shown in these figures, the amount of bowing tends to increase as a value of RF power for bias decreases.

Figure 6:
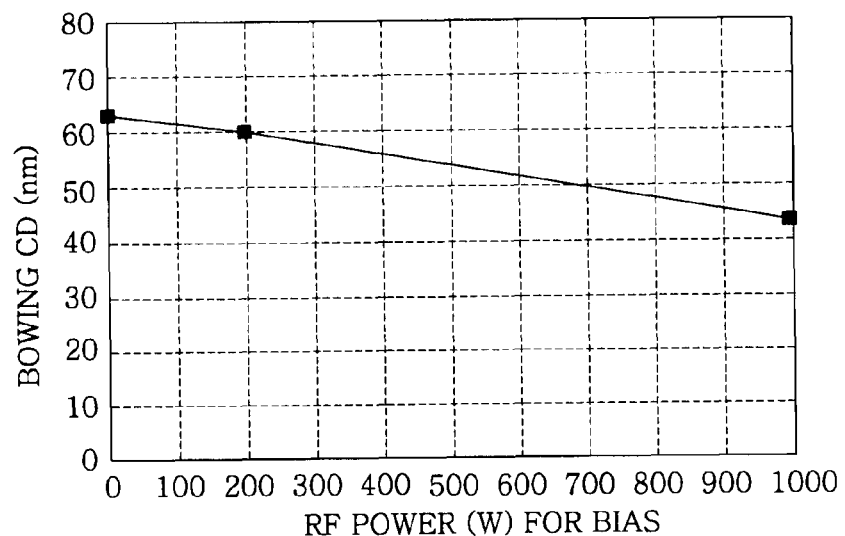
FIG. 6 is a graph showing a relation between RF power for bias of a treatment process and a bowing CD.

FIG. 6 shows a relation between a bowing CD (diameter of a portion having the largest diameter) (nm), which is represented by a vertical axis, and RF power (W) for bias in the treatment process, which is represented by a horizontal axis. As shown in FIG. 6, when the value of RF power for bias in the treatment process is increased, the bowing CD was observed to have a tendency to be linearly decreased. It is guessed that this is because formation of a SiC protection film by Ar plasma is promoted when the RF power for bias in the treatment process is increased. On this account, the RF power for bias to be applied in the treatment process is preferably 100 W or greater, more preferably 500 W or greater. In this case, since the semiconductor wafer used has the diameter of 30 cm, the RF power to be applied is preferably 0.14 W/cm² or greater, more preferably 0.7 W/cm² or greater when indicated by power per unit area. The above result was derived when Ar gas is used as a rare gas. If a heavier rare gas, for example, Xe gas, Kr gas or the like, is used, it is considered that some extent of effects is exhibited even under no application of RF power for bias in the treatment process.

Figure 7A:
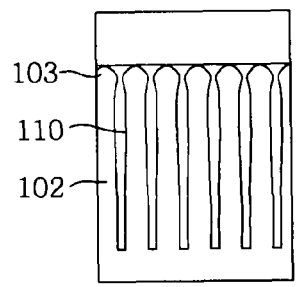
FIGS. 7A to 7C are views showing an examination result of a relation between upper electrode application RF power of a treatment process and an etching shape.
Figure 7B:
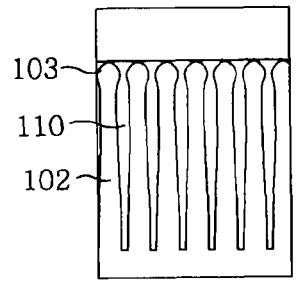
Figure 7C:
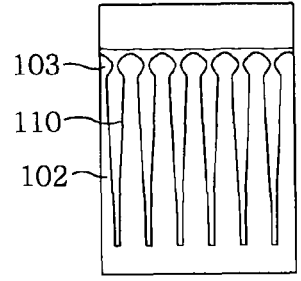

FIGS. 7A to 7C show an examination result of a relation between a value of RF power applied to an upper electrode (the upper electrode 21 shown in FIG. 1) in the treatment process and the amount of bowing. In this case, except for the value of RF power applied to the upper electrode in the treatment process, the plasma etching process was performed under the same conditions as shown below.

(SiON Film Etching Process)
Etching gas: $CF_4$=150 sccm
Pressure: 6.67 Pa (50 mTorr)
Power (upper/lower): 300/300 W
Time: one minute and 17 seconds
(First Organic Film Etching Process)
Etching gas: $CO/O_2$=150/300 sccm
Pressure: 6.67 Pa (50 mTorr)
Power (upper/lower): 2000/1000 W
Time: 10 seconds
(Treatment Process)
Treatment gas: Ar=750 sccm
Pressure: 2.67 Pa (20 mTorr)
Power (upper/lower): (2000, 1000, 800)/1000 W
Time: 15 seconds
(Second Organic Film Etching Process)
Etching gas: $CO/O_2$=150/300 sccm
Pressure: 2.67 Pa (20 mTorr)
Power (upper/lower): 2000/1000 W
Time: one minute and 30 seconds FIGS. 7A, 7B and 7C show that the RF power applied to the upper electrode is 2000 W, 1000 W and 800 W, respectively. As shown in these figures, the magnitude of the RF power applied to the upper electrode in the treatment process has little effect on the amount of occurred bowing.

Figure 8A:
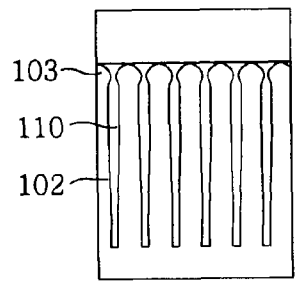
FIGS. 8A to 8C are schematic views showing an examination result of an effect of the presence or not of a first organic film etching process on an etching shape.
Figure 8B:
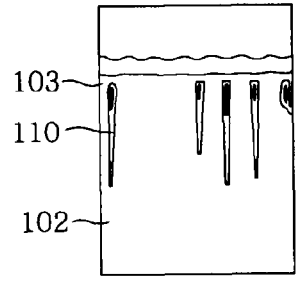
Figure 8C:
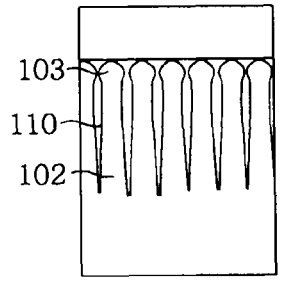

FIGS. 8B and 8C show examination results of etching shapes when the treatment process shown in FIG. 2D is performed, without the first organic film etching process shown in FIG. 2C, and then an organic film etching process is performed. FIG. 8A shows the case where the first organic film etching process was performed for comparison. A plasma etching process was performed according to the following recipe.

(SiON Film Etching Process)
Etching gas: $CF_4$=150 sccm
Pressure: 6.67 Pa (50 mTorr)
Power (upper/lower): 300/300 W
Time: one minute and 17 seconds
(First Organic Film Etching Process)
Etching gas: $CO/O_2$=150/300 sccm
Pressure: 2.67 Pa (20 mTorr)
Power (upper/lower): 2000/1000 W
Time: 10 seconds
(Treatment Process)
Treatment gas: Ar=750 sccm
Pressure: 2.67 Pa (20 mTorr)
Power (upper/lower): 2000/1000 W
Time: 15 seconds
(Second Organic Film Etching Process)
Etching gas: $CO/O_2$=150/300 sccm
Pressure: 2.67 Pa (20 mTorr)
Power (upper/lower): 2000/1000 W
Time: one minute and 20 seconds FIGS. 8B and 8C show the cases where the first organic film etching process was not performed. A plasma etching process was performed according to the following recipe. FIG. 8B is different from FIG. 8C only in that RF power for bias in the treatment process in FIG. 8B is 1000 W while RF power for bias in the treatment process in FIG. 8C is 500 W.

(SiON Film Etching Process)
Etching gas: $CF_4$=150 sccm
Pressure: 6.67 Pa (50 mTorr)
Power (upper/lower): 300/300 W
Time: one minute and 17 seconds
(Treatment Process)
Treatment gas: Ar=750 sccm
Pressure: 2.67 Pa (20 mTorr)
Power (upper/lower): 2000/(1000, 500) W
Time: 15 seconds
(Organic Film Etching Process)
Etching gas: $CO/O_2$=150/300 sccm Pressure: 2.67 Pa (20 mTorr)
Power (upper/lower): 2000/1000 W
Time: one minute and 30 seconds As shown in FIGS. 8B and 8C, when the treatment process was performed without performing the first organic film etching process, the amorphous carbon film 102 was etch-stopped halfway without being etched throughout in the organic film etching process.

Accordingly, it can be known that the first organic film etching process prior to the treatment process is indispensable. In addition, as can be seen from the bowing prevention mechanism shown in FIG. 3B, in order to form a protection film wholly on a side wall portion in which bowing is likely to occur (for example, upper 5 to 20% with respect to depth of the entire hole), the first organic film etching process is preferably performed until the side wall portion is exposed.

As described above, according to the above-described embodiment, there is provided a plasma etching method which is capable of effectively preventing bowing from occurring as compared to conventional techniques and performing finer processes with high precision. The present invention is not limited to the disclosed embodiment but may be modified in various ways. For example, the plasma etching apparatus is not limited to the parallel plate type in which RF powers are applied to the upper and the lower electrode as shown in FIG. 1 but any of other types of plasma etching apparatus may be used.

While the invention has been shown and described with respect to the embodiments, it will be understood by those skilled in the art that various changes and modification may be made without departing from the scope of the invention as defined in the following claims.

What is claimed is:

1. A plasma etching method for plasma-etching a target substrate including at least a target film to be etched, an organic film, a Si-containing film, and a photoresist film patterned on the Si-containing film which are stacked in that order from bottom, the method comprising:

a Si-containing film etching step of etching the Si-containing film by using the photoresist film as a first mask such that openings of the Si-containing film are formed;

a first organic film etching step of etching a portion of the organic film thereby forming holes in the portion of the organic film;

a treatment step of a treatment step of exposing, after the first organic film etching step, the Si-containing film and the organic film to a plasma of a rare gas such that a Si-containing protection film is formed on sidewalls of the holes;

a second organic film etching step of etching, after the treatment step, the remaining portion of the organic film exposed through the openings; and a target film etching step of etching the target film by using the organic film as a second mask; and wherein, in the treatment step, the Si-containing film and the organic film are exposed to a plasma of an additive gas provided with the plasma of the rare gas, and the organic film and the Si-containing film are not etched by the plasma of the additive gas.

2. The plasma etching method of claim 1, wherein the rare gas includes at least one of Ar gas, Xe gas and Kr gas.

3. The plasma etching method of claim 2, wherein RF power for bias is applied to the target substrate in the treatment step.

4. The plasma etching method of claim 1, wherein the organic film is an amorphous carbon film.

5. The plasma etching method of claim 1, wherein the Si-containing film is one of a SiON film, a SiC film and a SiN film.

6. A non-transitory computer storage medium storing a control program which operates on a computer, wherein, when executed, the control program controls a plasma etching apparatus to perform the plasma etching method of claim 1.

* * * * *